(12) United States Patent
Hsu

(10) Patent No.: US 7,391,280 B2
(45) Date of Patent: Jun. 24, 2008

(54) CIRCUIT AND METHOD FOR PULSE WIDTH MODULATION

(75) Inventor: Ham-Huah Hsu, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 684 days.

(21) Appl. No.: 10/709,488

(22) Filed: May 10, 2004

(65) Prior Publication Data

US 2005/0180499 A1     Aug. 18, 2005

(30) Foreign Application Priority Data

Feb. 17, 2004    (TW)  ............................... 93103702 A

(51) Int. Cl.
*H03K 7/08*      (2006.01)

(52) U.S. Cl. ....................................... 332/109; 375/238

(58) Field of Classification Search ................. 331/109, 331/1 A, 25; 375/238; 332/109; 318/599, 318/341; 364/768, 771
See application file for complete search history.

(56) References Cited

U.S. PATENT DOCUMENTS

| 4,772,833 | A | * | 9/1988 | Tanaka | ........................ | 318/599 |
| 5,177,373 | A | * | 1/1993 | Nakamura | .................. | 327/176 |
| 6,281,822 | B1 | * | 8/2001 | Park | ........................... | 341/144 |

* cited by examiner

*Primary Examiner*—Robert J. Pascal
*Assistant Examiner*—Ryan J Johnson
(74) *Attorney, Agent, or Firm*—Jianq Chyun IP Office

(57) ABSTRACT

A circuit and a method for performing pulse width modulation are provided. A pulse density modulator (PDM) is applied to receive the least N bits of the input data and to generate a pulse density modulation signal. The number of pulse of the pulse density modulation signal in $2^N$ frames correspond to a value of the least N bits of the input data. An adder is applied to generate a PWM data by adding a value of the most M bits of the input data to a value of the pulse density modulation signal generated by the PDM. A pulse width modulator is applied to generate a PWM signal dithering in $2^N$ frames according to the PWM data generated by the adder, so as to improve the audio quality of pulse width modulation and the Electro-Magnetic Interference (EMI) phenomenon.

6 Claims, 3 Drawing Sheets

US 7,391,280 B2

CIRCUIT AND METHOD FOR PULSE WIDTH MODULATION

CROSS REFERENCE TO RELATED APPLICATIONS

This application claims the priority benefit of Taiwan application serial no. 93103702, filed Feb. 17, 2004.

BACKGROUND OF INVENTION

1. Field of the Invention

The present invention relates to a circuit and a method for performing pulse width modulation, and more particularly, to a circuit and a method for performing pulse width modulation capable of improving the audio quality of pulse width modulation and the Electro-Magnetic Interference (EMI) phenomenon.

2. Description of Related Art

Pulse width modulation (PWM) is a modulation technique most commonly used in the digital circuit for processing audio signals. The so-called PWM technique adjusts a pulse width of the output audio signal by referring to an operating clock cycle that represents a PWM service rate and according to a value of the digitized audio data when generating the audio signal.

FIG. 1 is a schematic diagram of performing pulse width modulation on an audio data with 10 bits resolution. As shown in the diagram, T1 is an operating clock cycle that represents the pulse width modulation service rate, T2 is a frame cycle for PWM, and T3 is a sampling cycle of the audio signal. Since the most significant bit (MSB) of the audio data is commonly used to represent a signed value of the data, the maximum pulse width for transmitting a record of audio data (wherein, its frequency is generally referred as a frame rate for PWM), that is the frame cycle T2 is $2^9$ times of T1, i.e. T2=512×T1. The pulse width for physically transmitting data depends on the value of data to be transmitted. For example, if the value of data to be transmitted is 128, the duty cycle of the pulse in a frame is 128/512, and if the value of data to be transmitted is 100, the duty cycle of the pulse in a frame is 100/512.

In addition, in order to improve the quality of transmitting the audio signal, the pulse for each record of audio data are continuously transmitted with a plurality of frames. Therefore, the sampling cycle T3 of the audio signal is integral of the frame cycle T2. Accordingly, the frequency of the operating clock for providing the PWM service rate is directly proportional to the sampling rate of the audio signal, the PWM frame rate, and the resolution of the audio data. For example, if the sampling rate of the audio signal is 12 KHz, the resolution of the audio signal is 10 bits (including a symbol representing a signed value), and the pulse for each record of the audio data are continuously transmitted with 4 frames, i.e. when the PWM frame rate is 12 KHz×4=48 KHz, the frequency of the operating clock is 48 KHz×512=24 MHz. Therefore, the frequency of the operating clock increases along with the improvement of the audio quality, i.e. the increase of the audio data resolution. As a result, the EMI phenomenon is getting worse in such case.

SUMMARY OF INVENTION

Therefore, the present invention is directed to a circuit and a method of performing pulse width modulation. The circuit and method according to an embodiment of the present invention, are capable of improving the audio quality of pulse width modulation without having to increase the operating clock frequency; capable of reducing the operating clock frequency under the condition of providing the same PWM audio quality so as to improve the EMI phenomenon; and capable of providing more choices of sampling rate under the condition of providing the same audio quality and the same operating clock frequency.

In accordance with the above embodiment, a circuit for performing pulse width modulation is provided by the present invention. The circuit is adapted for generating a PWM signal according to an input data with M+N bits. The pulse width of the PWM signal dither in $2^N$ frames and correspond to the value of the input data. The PWM circuit comprises a pulse density modulator (PDM), a first adder and a pulse width modulator.

Wherein, the PDM receives the least N bits of the input data and generates a pulse density modulation signal, and the number of pulse of the pulse density modulation signal in $2^N$ frames is correspond to the value of the least N bits of the input data. The first adder electrically couples to the PDM and generates a PWM data by adding the value of the most M bits of the input data to the value of the pulse density modulation signal generated by the PDM. The pulse width modulator electrically couples to the first adder and generates a PWM signal dithering in $2^N$ frames according to the PWM data output from the first adder.

In an embodiment of the present invention, the PDM in the PWM circuit comprises a latch and a second adder. Wherein, the second adder electrically couples to the latch and generates a carry and a summation by adding the value of the least N bits of the input data mentioned above to the output of the latch, makes the output carry as the pulse density modulation signal mentioned above, and updates the latch with the calculated summation when converting the frame.

In an embodiment of the present invention, before the value of the most M bits of the input data is added to the value of the pulse density modulation signal by the first adder of the PWM circuit, the M bits input data is sign-extended to an input data with at least M+1 bits, so as to generate a PWM data with at least M+1 bits.

In an embodiment of the present invention, the PWM signal of the PWM circuit comprises a positive PWM signal and a negative PWM signal. In addition, the pulse width modulator of the PWM circuit comprises a latch, an absolute value calculator formed by an XOR gate, for example, a counter, a comparator and a PWM output switch. Wherein, the latch electrically couples to the first adder and updates the latch value with the PWM data when converting the frame. The absolute value calculator electrically couples to the latch and generates an absolute value of the PWM data output from the latch. The counter generates a counting value according to an operating clock. The comparator electrically couples to the counter and the absolute value calculator, and generates a comparison signal by comparing the absolute value of the PWM data with the counting value. The PWM output switch electrically couples to the latch and the comparator, and switches the comparison signal to either the positive PWM signal or the negative PWM signal according to the signed bit of the PWM data output from the latch.

The present invention is also directed to a method of performing pulse width modulation. The method generates a PWM signal according to an input data with M+N bits. The pulse width dither in $2^N$ frames and correspond to the value of the input data. The method of performing pulse width modulation comprises the following steps: receiving the least N bits of the input data, and generating a pulse density modulation signal, wherein the number of the pulse of the pulse density modulation signal in $2^N$ frames correspond to the value of the least N bits of the input data; generating a PWM data by adding the value of the most M bits of the input data to the value of the pulse density modulation signal; and generating a PWM signal dithering in $2^N$ frames according to the PWM data.

Wherein, before adding the value of the most M bits of the input data to the value of the pulse density modulation signal, the M bits input data is sign-extended to an input data with at least M+1 bits, so as to generate a PWM data with at least M+1 bits.

Wherein, the PWM signal comprises a positive PWM signal and a negative PWM signal. In addition, the step of generating a dithering PWM signal comprises following steps: calculating an absolute value of the PWM data; generating a counting value according to an operating clock; generating a comparison signal by comparing the absolute value of the PWM data with the counting value; and switching the comparison signal to either the positive PWM signal or the negative PWM signal according to the signed bit of the PWM data.

In summary, the present invention has at least the following advantages.

1. In the present invention, the dithering PWM signal is generated by only feeding the most M bits of the M+N bits input data into the pulse width modulator, and by only feeding the least N bits of the input data into the PDM. Therefore, compared with the conventional M bits pulse width modulator, the present invention can improve the PWM audio quality without having to increase the operating clock frequency.

2. Under the condition of providing the same PWM audio quality, for example, if the input data is I bits, only the most I-N bits of the input data is fed into the pulse width modulator, and the least N bits of the input data is fed into the PDM to generate the dithering PWM data. Since fewer bits are fed into the pulse width modulator, the operating clock frequency is reduced and the EMI phenomenon is improved.

For example: assuming the operating frequency for a 10 bits pulse width modulator is 24 MHz, thus its frame frequency is 48 KHz (24 MHz/$2^9$). With such method, under the condition of N=2 and the same 10 bits audio quality and frame frequency, its operating frequency is only 6 MHz, since the frame frequency for a physically used 8 bits pulse width modulator is 48 KHz. The 6 MHz operating frequency effectively reduces its operating frequency and improves the EMI phenomenon.

3. Since fewer bits are fed into the pulse width modulator, the maximum pulse width required by the pulse width modulator is also reduced. Therefore, under the condition of providing the same operating clock frequency, the present invention provides more choices of sampling rate.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1:
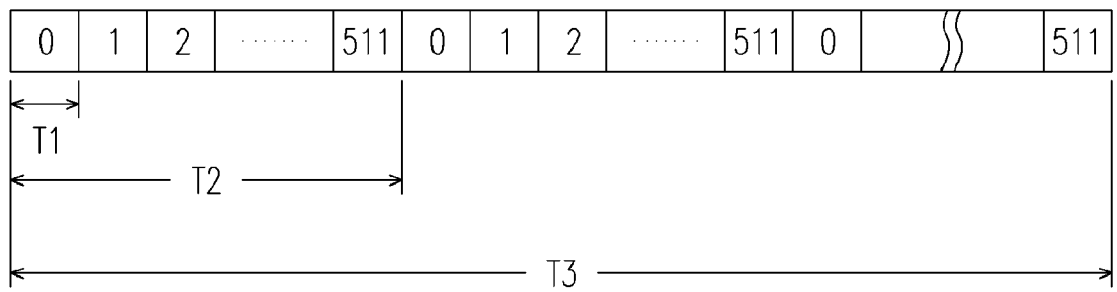
FIG. 1 is a schematic diagram of performing pulse width modulation on an audio data with 10 bits resolution.
Figure 2:
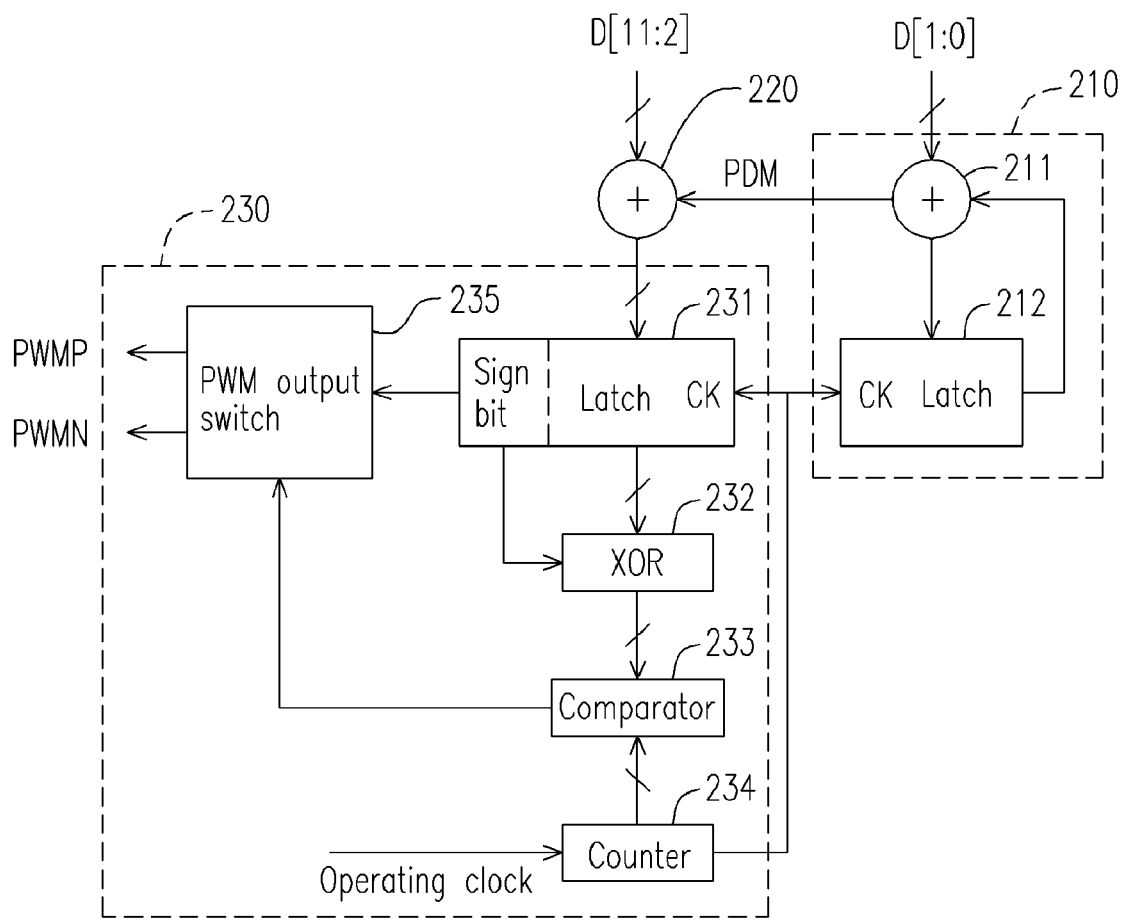
FIG. 2 is a schematic block diagram of a PWM circuit according to an embodiment of the present invention.

FIG. 2 is a schematic block diagram of a PWM circuit according to a preferred embodiment of the present invention. The pulse width modulator is suitable for generating a PWM signal according to an input data with M+N bits. The pulse width of the PWM signal dither in $2^N$ frames and correspond to the value of the input data. Wherein, since the input data D[M:N] has a signed value, i.e. the D[M] bit is a signed bit, the generated PWM signal comprises a positive PWM signal PWMP and a negative PWM signal PWMN.

In FIG. 2, in the case of M=10, N=2, if the input data D[11:0] is "00,1000,0000,01", i.e. if the pulse width of the positive PWM signal PWMP to be transmitted is 128.25 operating clock cycles, a positive PWM signal PWMP with 128 operating clock cycles are transmitted in each of the $1^{st}$~$3^{rd}$ frame, and a positive PWM signal PWMP with 129 operating clock cycles are transmitted in the $4^{th}$ frame. Accordingly, the average pulse width of the positive PWM signal PWMP is 128.25 operating clock cycles. Its operation principle is described in detail hereinafter.

As shown in FIG. 2, the PWM circuit comprises a PDM (Pulse Density Modulator) 210, an adder 220, and a pulse width modulator 230. Wherein, the PDM 210 comprises a latch 212 and an adder 211. The pulse width modulator 230 comprises a latch 231, an absolute value calculator 232 that is formed by an XOR gate for example, a counter 234, a comparator 233, and a PWM output switch 235.

In FIG. 2, the PDM 210 receives the least 2 bits of the input data D[1:0], and generates a pulse density modulation signal PDM. The pulse number of the pulse density modulation signal PDM in 4 frames correspond to the value of the input data D[1:0]. For example, in the case that D[0:1] in the previous case is "01". In the $1^{st}$ frame, the summation generated by the adder 211 is "01", since there is no carry, the pulse density modulation signal PDM is "0", and meanwhile the value of "01" is saved in the latch 212. In the $2^{nd}$ frame, the summation generated by the adder 211 is "01"+"01"="10", since there is no carry, the pulse density modulation signal PDM is "0", and meanwhile the value of "10" is saved in the latch 212. In the $3^{rd}$ frame, the summation generated by the adder 211 is "01"+"10"="11", since there is no carry, the pulse density modulation signal PDM is "0", and meanwhile the value of "11" is saved in the latch 212. In the $4^{th}$ frame, the summation generated by the adder 211 is "01"+"11"="100", since there is a carry, the pulse density modulation signal PDM is "1" due to the carry, thus in the $4^{th}$ frame, the value of "1" is propagated to the adder 220, such that the output of the adder 220 becomes "00,1000,0000"+"1"="00,1000,0001", that is the PWM data with a value of 129 propagated to the pulse width modulator 230. Therefore, the pulse width modulator 230 respectively generates the positive PWM signal PWMP whose pulse width is 128, 128, 128, and 129 operating clock cycles and is dithering in 4 frames according to the PWM data generated by the adder 220.

In the present embodiment, since the input data D[11:0] has a signed value, and D[11] is a signed bit, if the input data D[11:2] fed into the adder 220 is "01,1111,1111" and the pulse density modulation signal PDM generated by the adder 211 is "1", the output of the adder 220 is "10,0000,0000", in such case the signed value of the PWM data fed into the latch 231 is not correct. In order to solve this problem, in the present embodiment, before the input data D[11:2] is added to the value of the pulse density modulation signal PDM by the adder 220, the input data D[11:2] is sign extended to an input data with at least 11 bits, so as to generate a PWM data with at least 11 bits. For example, in the case where the input data D[11:2] fed into the adder 220 in the previous case is "01,1111,1111" and the pulse density modulation signal PDM generated by the adder 211 is "1", the input data D[11:2] is sign extended to D[12:2]="001,1111,1111" by the adder 220 first, and its summation is "010,0000,0000", such that the correctness of the signed bit is not impacted.

Referring to FIG. 2 again, the counter 234 in the diagram generates a counting value according to an operating clock. Wherein, the operating clock is a reference clock representing a PWM service rate. Besides generating the counting value, the counter 234 also generates a frame conversion signal, which is then propagated to the latches 212 and 213, so as the latches 212 and 213 latch the output of the adders 211 and 220 respectively when converting the frame. Afterwards, the absolute value calculator 232 calculates and generates an absolute value of the PWM data generated by the latch 231, and it is obtained by performing an XOR operation on the signed bit of the PWM data and other bits of the PWM data by using an XOR gate shown in the diagram. Then, the comparator 233 generates a comparison signal that is then sent to the PWM output switch 235 by comparing the absolute value of the PWM data generated by the absolute value calculator 232 and the counting value generated by the counter 234. Finally, the PWM output switch 235 switches the comparison signal to either the positive PWM signal PWMP or the negative PWM signal PWMN according to the signed bit of the PWM data generated by the latch 231.

In summary, a method for performing pulse width modulation is concluded. The method is suitable for generating a PWM signal according to an input data with M+N bits. The pulse width of the PWM signal dither in 2^N frames and correspond to the value of the input data. The method for performing pulse width modulation comprises following steps: receiving the least N bits of the input data, and generating a pulse density modulation signal, wherein the number of the pulse of the pulse density modulation signal in 2^N frames is corresponded to the value of the least N bits of the input data; generating a PWM data by adding the value of the most M bits of the input data to the value of the pulse density modulation signal; and generating a PWM signal dithering in 2^N frames according to the PWM data.

Wherein, before adding the value of the most M bits of the input data to the value of the pulse density modulation signal, the M bits input data is sign extended to an input data with at least M+1 bits, so as to generate a PWM data with at least M+1 bits.

Wherein, the PWM signal comprises a positive PWM signal and a negative PWM signal. In addition, the step of generating a dithering PWM signal comprises following steps: calculating an absolute value of the PWM data; generating a counting value according to an operating clock; generating a comparison signal by comparing the absolute value of the PWM data with the counting value; and switching the comparison signal to either the positive PWM signal or the negative PWM signal according to the signed bit of the PWM data.

Figure 3:
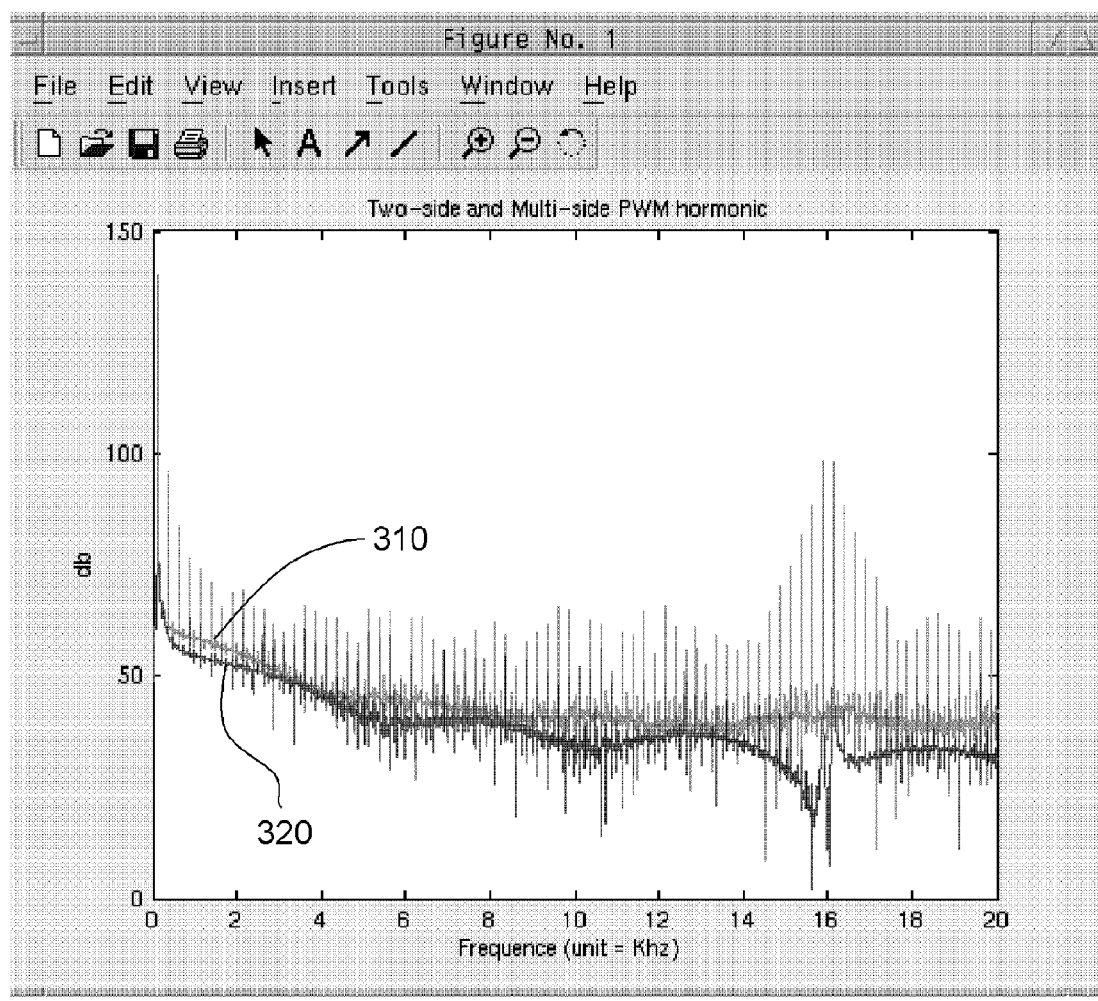
FIG. 3 is a schematic comparison diagram of a case using MATLAB to simulate a 10 bits conventional circuit and a case using MATLAB to simulate a circuit provided by an embodiment of the present invention.
Figure 4:
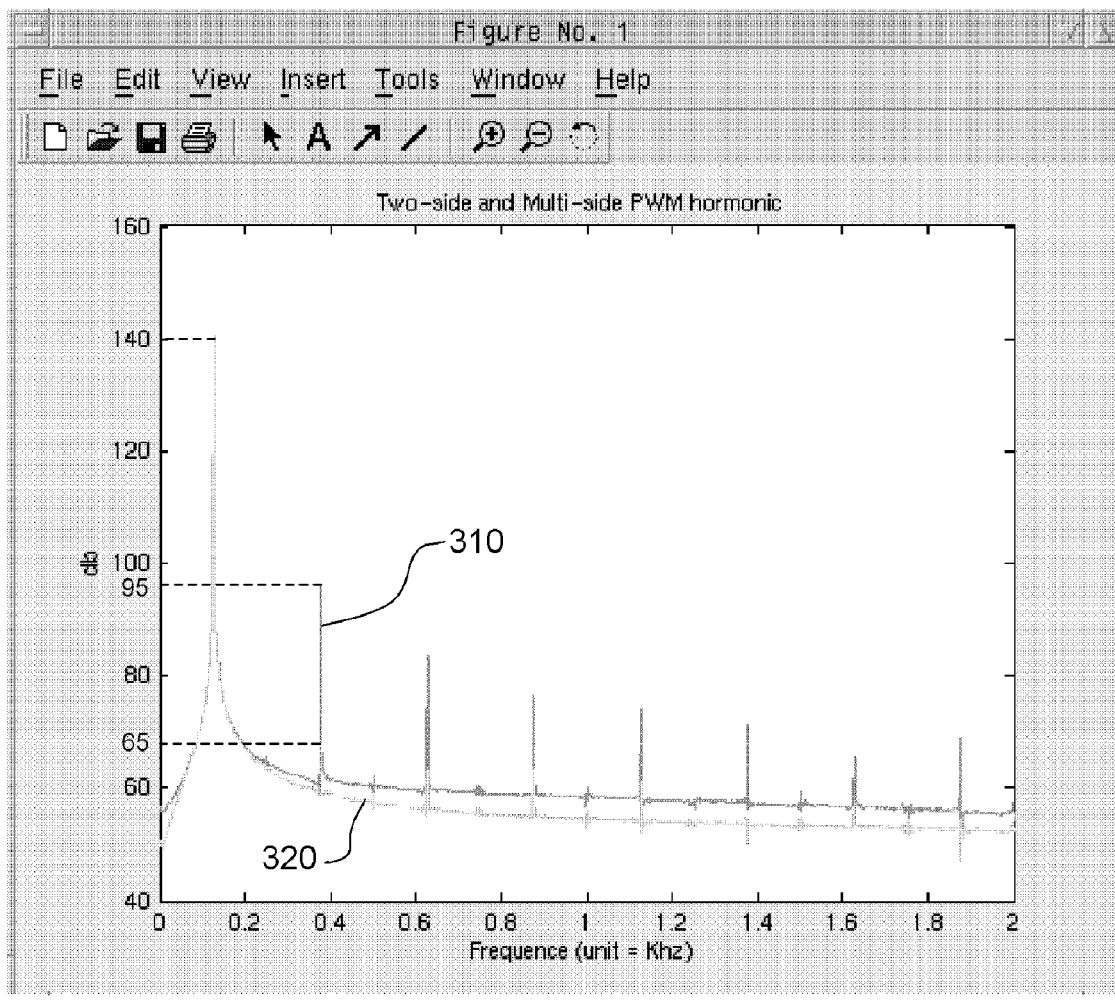
FIG. 4 is a magnified diagram of the 0~2K Hz portion of the frequency range shown in FIG. 3.

Referring to both FIG. 3 and FIG. 4, FIG. 3 is a schematic comparison diagram of a case using MATLAB to simulate a 10 bits conventional circuit and a case using MATLAB to simulate a circuit provided by the present invention. FIG. 4 is a magnified diagram of the 0~2K Hz portion of the frequency range shown in FIG. 3. Wherein, the reference number 310 represents an output spectrum of the conventional circuit, and the reference number 320 represents an output spectrum of the circuit provided by the present invention. As shown in FIG. 4, the strength of the output signal for both circuits are 140 dB, whereas the output noise level of the conventional circuit is 95 dB, and the output noise level of the circuit provided by the present invention is 65 dB. Therefore, the signal noise ratio (SNR) of the circuit provided by the present invention is 140 dB 65 dB=75 dB, and the signal noise ratio (SNR) of the conventional circuit is 140 dB 95 dB=45 dB. Accordingly, compared with to the conventional circuit, the audio quality generated by the circuit provided by the present invention is obviously improved under the condition of the same PWM service rate.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

The invention claimed is:

1. A circuit for performing pulse width modulation suitable for generating a PWM signal according to an input data with M+N bits, the pulse width of the PWM signal dithering in 2^N frames and corresponding to a value of the input data, comprising:

a pulse density modulator (PDM), for receiving the least N bits of the input data and generating a pulse density modulation signal, wherein a number of pulse of the pulse density modulation signal in 2^N frames correspond to a value of the least N bits of the input data;

a first adder, electrically coupled to the PDM for generating a PWM data by adding the most M bits of the input data to a value of the pulse density modulation signal; and a pulse width modulator, electrically coupled to the first adder for generating a PWM signal dithering in 2^N frames according to the PWM data, wherein before a value of the most M bits of the input data is added to the value of the pulse density modulation signal by the first adder, the M bits input data is sign-extended to an input data with at least M+1 bits, so as to generate the PWM data with at least M+1 bits.

2. The circuit for performing pulse width modulation of claim 1, wherein the PDM comprises:

a latch; and a second adder, electrically coupled to the latch for generating a carry and a summation by adding a value of the least N bits of the input data to an output of the latch, outputting the carry as the pulse density modulation signal, and updating the latch with the summation when converting the frame.

3. The circuit of performing pulse width modulation of claim 1, wherein the PWM signal comprises a positive PWM signal and a negative PWM signal, and the pulse width modulator comprises:

a latch, electrically coupled to the first adder for updating the latch value with the PWM data when converting the flame;

an absolute value calculator, electrically coupled to the latch for generating an absolute value of the PWM data output from the latch;

a counter, for generating a counting value according to an operating clock;

a comparator, electrically coupled to the counter and the absolute value calculator for generating a comparison signal by comparing the absolute value of the PWM data with the counting value; and a PWM output switch, electrically coupled to the latch and the comparator for switching the comparison signal to either the positive PWM signal or the negative PWM signal according to a signed bit of the PWM data output from the latch.

4. The circuit for performing pulse width modulation of claim 3, wherein the absolute value calculator is made of an XOR gate.

5. A method of performing pulse width modulation suitable for generating a PWM signal according to an input data with M+N bits, the pulse width of the PWM signal dithering in $2^N$ frames and corresponding to a value of the input data, comprising:

receiving least N bits of the input data, and generating a pulse density modulation signal, wherein a number of the pulse of the pulse density modulation signal in $2^N$ frames correspond to a value of the least N bits of the input data;

generating a PWM data by adding most M bits of the input data to a value of the pulse density modulation signal; and generating a PWM signal dithering in $2^N$ frames according to the PWM data, wherein before adding the value of the most M bits of the input data to the value of the pulse density modulation signal, the M bits input data is sign-extended to an input data with at least M+1 bits, so as to generate the PWM data with at least M+1 bits.

6. The method of performing pulse width modulation of claim 5, wherein the PWM signal comprises a positive PWM signal and a negative PWM signal, and the step of generating the PWM signal dithering comprises:

calculating an absolute value of the PWM data;

generating a counting value according to an operating clock;

generating a comparison signal by comparing the absolute value of the PWM data with the counting value; and switching the comparison signal to either the positive PWM signal or the negative PWM signal according to a signed bit of the PWM data.

* * * * *